United States Patent
Cordes et al.

(10) Patent No.: US 10,143,099 B2
(45) Date of Patent: Nov. 27, 2018

(54) SEMICONDUCTOR MODULE WITH GRIPPING SOCKETS, METHODS FOR GRIPPING, FOR MOVING AND FOR ELECTRICALLY TESTING A SEMICONDUCTOR MODULE

(71) Applicant: Infineon Technologies AG, Neubiberg (DE)

(72) Inventors: Rene Cordes, Erwitte (DE); Christoph Koch, Salzkotten (DE); Michael Larisch, Regensburg (DE); Sven Schennetten, Balve (DE)

(73) Assignee: Infineon Technologies AG, Neubiberg (DE)

( * ) Notice: Subject to any disclaimer, the term of this patent is extended or adjusted under 35 U.S.C. 154(b) by 341 days.

(21) Appl. No.: 14/830,333

(22) Filed: Aug. 19, 2015

(65) Prior Publication Data

US 2016/0057875 A1 Feb. 25, 2016

(30) Foreign Application Priority Data

Aug. 21, 2014 (DE) .......................... 10 2014 111 995

(51) Int. Cl.
*G01R 31/20* (2006.01)
*H05K 5/02* (2006.01)
(Continued)

(52) U.S. Cl.
CPC .......... *H05K 5/023* (2013.01); *B25J 11/0095* (2013.01); *G01R 31/2607* (2013.01);
(Continued)

(58) Field of Classification Search
CPC .... H05K 5/023; H05K 5/0065; H05K 5/0069; H05K 5/0091; B25J 11/0095;
(Continued)

(56) References Cited

U.S. PATENT DOCUMENTS

| 6,211,462 | B1 | 4/2001 | Davis et al. |
| 7,793,819 | B2 * | 9/2010 | Guth .................... B23K 1/0016 156/285 |

(Continued)

FOREIGN PATENT DOCUMENTS

| CN | 101689018 A | 3/2010 |
| CN | 101963647 A | 2/2011 |
| CN | 102446910 A | 5/2012 |

OTHER PUBLICATIONS

Stockmeier, From Packaging to "Un"-Packaging—Trends in Power Semiconductor Modules, Proceedings of the 20th International Symposium on Power Semiconductor Devices & IC's, 2008.*

*Primary Examiner* — Daniel Miller
(74) *Attorney, Agent, or Firm* — Murphy, Bilak & Homiller, PLLC

(57) ABSTRACT

One aspect of the invention relates to a semiconductor module with an outer housing having four side walls, and a circuit carrier, which is mounted on the outer housing and has an upper side and a lower side opposite the upper side. A semiconductor chip is arranged on the upper side and in the outer housing. A first gripping socket, which is formed as an indentation, extends from the outer side of the outer housing into a first of the side walls.

4 Claims, 6 Drawing Sheets

(51) Int. Cl.
  *B25J 11/00* (2006.01)
  *G01R 31/26* (2014.01)
  *G01R 31/28* (2006.01)
  *H01L 21/687* (2006.01)
  *H05K 5/00* (2006.01)
  *G01R 31/44* (2006.01)

(52) U.S. Cl.
  CPC ......... *G01R 31/2893* (2013.01); *G01R 31/44* (2013.01); *H01L 21/68728* (2013.01); *H01L 21/68735* (2013.01); *H01L 21/68778* (2013.01); *H05K 5/0065* (2013.01); *H05K 5/0069* (2013.01); *H05K 5/0091* (2013.01); *H01L 2224/32225* (2013.01)

(58) Field of Classification Search
  CPC ............ G01R 31/2607; G01R 31/2893; H01L 21/68728; H01L 21/68735; H01L 21/68778
  See application file for complete search history.

(56) References Cited

U.S. PATENT DOCUMENTS

| | | | |
|---|---|---|---|
| 2003/0203158 A1 | 10/2003 | Farnworth et al. | |
| 2007/0134359 A1 | 6/2007 | Farnworth et al. | |
| 2007/0138466 A1* | 6/2007 | Lee .................... | G01R 31/2893 257/48 |
| 2009/0236202 A1* | 9/2009 | Park .................... | G01R 31/2893 198/341.05 |
| 2012/0293967 A1* | 11/2012 | Borghoff ................ | H01L 23/10 361/747 |

* cited by examiner

SEMICONDUCTOR MODULE WITH GRIPPING SOCKETS, METHODS FOR GRIPPING, FOR MOVING AND FOR ELECTRICALLY TESTING A SEMICONDUCTOR MODULE

PRIORITY CLAIM

This application claims priority to German Patent Application No. 10 2014 111 995.9 filed on 21 Aug. 2014, the content of said application incorporated herein by reference in its entirety.

TECHNICAL FIELD

The present invention relates to semiconductor modules and to methods for gripping, moving and electrically testing the latter.

BACKGROUND

For semi-automated, or in the ideal case fully automated fabrication, as used expediently for example in the production of large numbers of parts (for example in the automotive field), it is advantageous if the semiconductor modules can pass through the automatic part of the fabrication, or the fully automatic fabrication, as far as possible without manual intervention. To this end, the semiconductor modules have previously been taken up by a magnetic holder of a positioning device. As the semiconductor modules have usually consisted essentially of nonmagnetic parts, magnetic fastening nuts have been integrated into the module housing, although this entails high complexity and costs.

SUMMARY

The object of the present invention is to provide measures which allow straightforward and economical semiautomatic or fully automatic fabrication and/or testing of a semiconductor module.

According to a first embodiment, a semiconductor module includes an outer housing having four side walls and a circuit carrier, which is mounted on the outer housing and has an upper side and a lower side opposite the upper side. A semiconductor chip located on the upper side is arranged in the outer housing. A first gripping socket, which is formed as an indentation, extends from the outer side of the outer housing into a first of the side walls.

According to a second embodiment, a method for gripping a semiconductor module configured according to the first embodiment is disclosed. In the method, in addition to the semiconductor module, a positioning device which has a first gripping finger is also provided. In order to grip the semiconductor module with the aid of the positioning device, the first gripping finger engages in the first gripping socket.

According to a third embodiment, a method for moving a semiconductor module is disclosed. In the method, the semiconductor module according to the first embodiment is first gripped according to the second embodiment by a positioning device and then moved by means of the positioning device.

According to a third embodiment, a method for electrically testing a semiconductor module which comprises a number of external electrical terminals on its side facing away from the circuit carrier is disclosed. To this end, an electrical measuring adapter is provided. The semiconductor module is moved by means of the positioning device in accordance with the third embodiment, in such a way that the semiconductor module is positioned relative to the measuring adapter so that the external electrical terminals face toward the measuring adapter. The external terminals are then electrically contacted by means of the measuring adapter. The electrical functionality of the semiconductor module is subsequently tested.

BRIEF DESCRIPTION OF THE DRAWINGS

The invention will be explained in more detail below with the aid of exemplary embodiments with reference to the appended figures. In the figures, references which are the same refer to elements which are the same or have the same effect.

DETAILED DESCRIPTION

Figure 1:
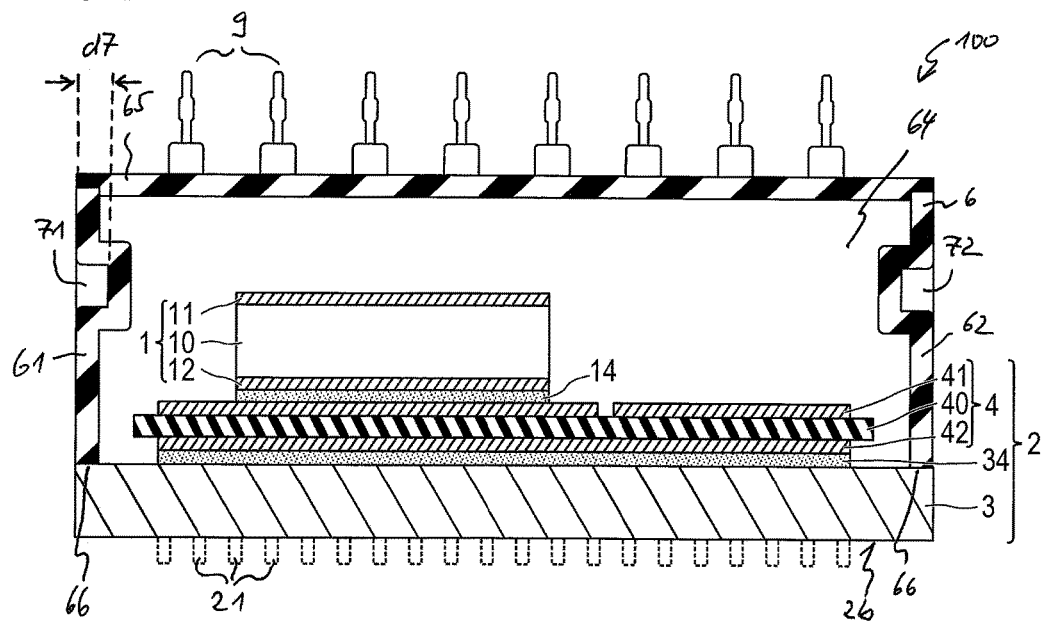
FIG. 1 shows a cross section through a semiconductor module, the outer housing of which respectively comprises a gripping socket on two mutually opposing side walls.
Figure 2:
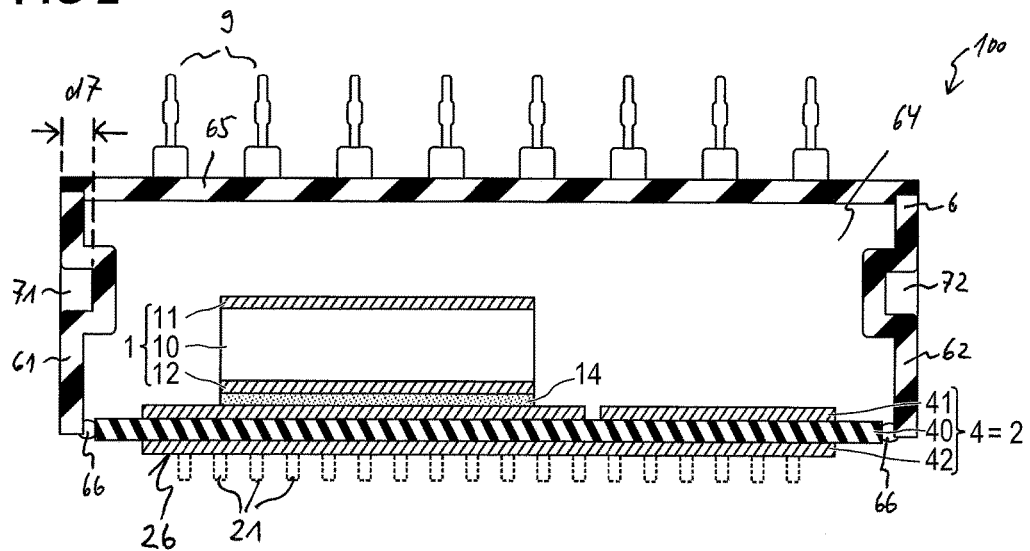
FIG. 2 shows a cross section through a further semiconductor module, the outer housing of which respectively comprises a gripping socket on two mutually opposing side walls.

FIGS. 1 and 2 respectively show a semiconductor module 100 having an outer housing 6 and a circuit carrier 2. An "outer housing" is intended to mean a housing which is freely accessible even during intended operation of the semiconductor module 100, for example when it is used to drive a motor or inverter. The outer housing 6 has four side walls 61, 62, 63, 64, which respectively delimit the internal space of the outer housing 6 in a direction parallel to the circuit carrier 2. The third side wall 63 cannot be seen in FIGS. 1 and 2 because of the sectional view.

A circuit carrier 2 is mounted on the outer housing 6. This circuit carrier has an upper side 2t, on which a semiconductor chip 1 is fitted, and a lower side 2b opposite the upper side 2t. On its lower side 2b, the circuit carrier 2 may optionally also have a pin or pin-fin structure 21 (represented by dashes). As an alternative, the lower side 2b may be planar or essentially planar. The waste heat generated in the semiconductor chip 1 during operation of the semiconductor module 100 is primarily dissipated by the lower side 2b and—if present—the pin or pin-fin structure 21.

The semiconductor chip 1 comprises a semiconductor body 10, as well as a first load terminal 11 and a second load terminal 12, which are arranged on mutually opposing sides of the semiconductor body 10. The first load terminal 11 is arranged on the side facing away from the circuit carrier 2, and the second load terminal 12 is arranged on the side of the semiconductor body 10 facing toward the circuit carrier 2. A control terminal, which is arranged on the side of the semiconductor body 10 facing away from the circuit carrier 2, may optionally also be provided.

Any desired semiconductor component may be integrated in the semiconductor chip 1, for example a diode or a controllable semiconductor component, for example a MOSFET, an IGBT, a JFET, a thyristor etc. The semiconductor component comprises a load path, which is formed between the first load terminal 11 and the second load terminal 12, and through which a load current flows during operation of the semiconductor module 100. If the semiconductor component is a controllable semiconductor component, the load current may be controlled by applying a control signal to the control terminal.

The first and second load terminals 11, 12 and, if present, the control terminal 13 may respectively be a contact pad, for example a metallization layer, which is applied on the semiconductor body 10. Such contact pads are already applied onto the semiconductor body 10 during production of the semiconductor chip 1. The first and second load terminals 11, 12 and, if present, the control terminal 13 are therefore already a part of the semiconductor chip 1, before the latter is mounted on the circuit carrier 2.

Depending on the type of semiconductor component produced in a semiconductor chip 1, the first and second load terminals 11 and 12 may for example be an anode and a cathode, a cathode and an anode, a source and a drain, a drain and a source, an emitter and a collector, or a collector and an emitter. A control terminal may, for example, be a gate terminal or a base terminal.

The semiconductor body 10 of a semiconductor chip 1 may consist of any desired basic semiconductor material, for example silicon, silicon carbide, gallium nitride, gallium arsenide, etc.

The circuit carrier 2 comprises a substrate 4, which has a dielectric insulation carrier 40 that is configured as a thin layer and is coated with a structured upper metallization layer 41, and on its opposite side from the upper metallization layer 41 with a lower metallization layer 42. Highly electrically conductive metals, for example, copper or copper alloys, aluminum or aluminum alloys, are suitable materials for the upper metallization layer 41 and the relevant lower metallization layer. The upper metallization layer 41 and/or the lower metallization layer 42 may, independently of one another, respectively have a thickness in the range of from 0.05 mm to 2.5 mm. The thickness of the insulation carrier 40 may, for example, lie in the range of from 0.1 mm to 2 mm. Thicknesses larger or smaller than those indicated are, however, likewise possible.

The substrate 4 may optionally be a ceramic substrate, in which the insulation carrier 40 is configured as a ceramic layer or consists of ceramic. The ceramic layer may, for example, be a layer of or comprising aluminum oxide ($Al_2O_3$), aluminum nitride (AlN) or zirconium oxide ($ZrO_2$). Other electrically insulating ceramic layers may, however, likewise be used.

In the case of a substrate 4 configured as a ceramic substrate, it may for example be configured as a DCB substrate (DCB=Direct Copper Bonding), as a DAB substrate (DAB=Direct Aluminum Bonding), as an AMB substrate (AMB=Active Metal Brazing) or as an IMS substrate (IMS=Insulated Metal Substrate).

In order to mount the semiconductor chip 1 on the substrate 4, the semiconductor chip 1 is connected at its second load terminal 12 by means of a connecting layer 14 with a material fit to the upper metallization layer 41. The connection may optionally be electrically conductive, so that the second load terminal 12 and the upper metallization layer 41 are electrically conductively connected by the connecting layer 14. The connecting layer 14 may for example be a solder layer, a layer comprising sintered metal powder (for example a sintered silver powder), or a layer of a conductive adhesive. If an electrically conductive connection between the second load terminal 12 and the upper metallization layer 41 is not desired, the connecting layer 14 may also be dielectric, for example a dielectric adhesive. In principle, instead of a semiconductor chip 1 as described above, as an alternative or in addition a semiconductor chip 1 configured in any other desired way may be fitted on the circuit carrier 2.

In order to produce the semiconductor module 100, the circuit carrier 2 with the semiconductor chip 1 prefitted may be fastened on the outer housing 6, for example by bonding by means of an adhesive 66. On its upper side facing away from the circuit carrier 2, the outer housing 6 may also comprise a housing cover 65. The latter may be placed on the side walls 61, 62, 63, 64 or, as an alternative, formed integrally therewith. Such a housing cover 65 is not, however, absolutely necessary. For electrical insulation of the electrical component parts installed in the outer housing 6, the interior of the outer housing 6 may also be filled with a dielectric encapsulation compound—not represented—, for example a silicone gel.

Optionally, the semiconductor module 100 may comprise one or more external electrical terminals 9, which extend out of the outer housing 6 on the upper side, facing away from the circuit carrier 2, of the outer housing 6. For the sake of clarity, the electrical bonding, present in the interior of the outer housing 6, of the external terminals 9 to the circuit formed on the circuit carrier 2 is not shown.

In the case of the semiconductor module 100 according to FIG. 1, in addition to the substrate 4 the circuit carrier 2 also has a base plate 3. The latter may, for example, be a metal plate. Such a base plate may for example comprise a metal layer, for example of aluminum, an aluminum alloy, copper or a copper alloy. It is likewise possible for a base plate 2 to comprise a layer of an MMC material (MMC=metal matrix composite).

Optionally, this metal layer may be provided on its side facing toward the substrate 4 with a thin surface metallization, which may for example be used to improve the solderability and/or to prevent oxidation of the metal layer. For example, the thin surface metallization may be a nickel layer. Such a surface metallization may, for example, be applied electrolytically onto the metal layer.

If the semiconductor module 100 has a base plate 3, this is connected by means of a connecting layer 34 with a material fit to the lower metallization layer 42. The connecting layer 34 may, for example, be a solder layer or a layer of sintered metal powder (for example a sintered silver powder).

In the case of a semiconductor module 100 whose circuit carrier 2 comprises a base plate 3, the lower side of the latter—as shown in FIG. 1—at the same time forms the lower side 2*b* of the circuit carrier 2. Likewise, however, in the case of a semiconductor module 100 without a base plate 2, it is possible for the side, facing away from the insulation carrier 40, of the lower metallization layer 42—as shown in FIG. 2—at the same time to constitute the lower side 2*b* of the circuit carrier 2.

In order to be able to move the semiconductor module 100 during fabrication and/or electrical testing, the outer housing 6 comprises on at least a first (61) of the side walls 61, 62, 63, 64 at least one first gripping socket 71, in which a gripping finger of a positioning device can respectively engage in order to grip the semiconductor module 100 and then move, for example invert, rotate, turn or tilt, the latter, etc. FIGS. 1 and 2 show a first gripping socket 71, which is formed in the first side wall 61 and a second gripping socket 72, which is formed in a second side wall 62 opposite the first side wall 61. In principle, the depth d7 of the gripping sockets 71, 72 may be selected in any desired way. It may, for example, be at least 1 mm.

Figure 3:
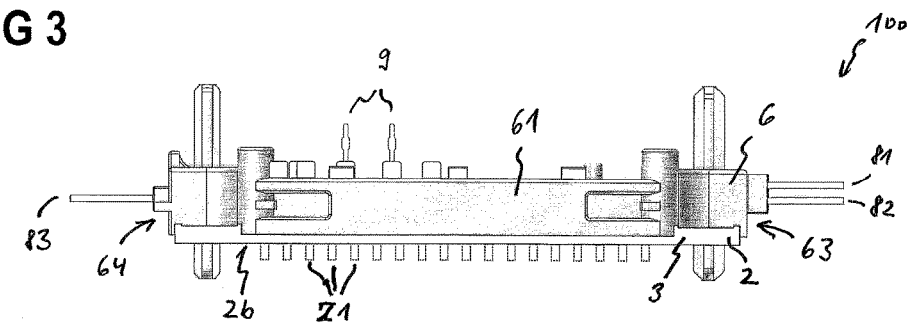
FIG. 3 shows a side view of a semiconductor module with a view of a side wall, into which two gripping sockets extend.

FIG. 3 shows a side view of a semiconductor module 100. As in the case of all other semiconductor modules 100 according to the present invention, it may have a basic structure as explained with the aid of FIGS. 1 and 2.

Figure 4:
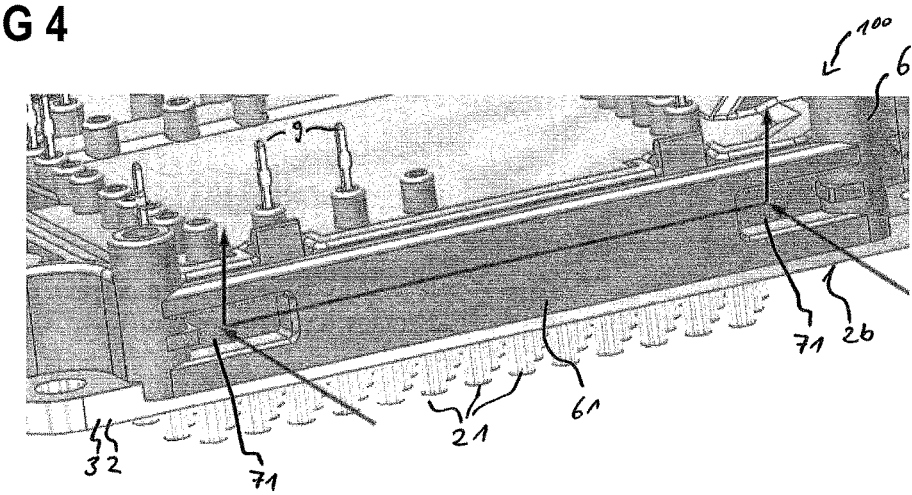
FIG. 4 shows a perspective view of a section of the semiconductor module according to FIG. 2.

As represented, the first side wall 61 comprises at least one first gripping socket 71 (only two are represented by way of example in FIG. 1), each of which is formed as an indentation that extends from the outer side of the outer housing 6 into the first side wall 61. As can likewise be seen in FIG. 3, as an alternative or in addition to the at least one external terminal 9 arranged on the side, facing away from the circuit carrier 2, of the outer housing 6, a semiconductor module 100 may also comprise one or a plurality of further external electrical terminals 81, 82, 83, each of which extends out of the outer housing 6 on one (the same one or a different one) of the side walls 61, 62, 63, 64. FIG. 4 shows a perspective view of an enlarged section of the semiconductor module 100 according to FIG. 3.

As a result of the first side wall 61 having two first gripping sockets 71 separated from one another, in each of which a gripping finger can engage, the semiconductor module 100 can be positioned very precisely by a suitably configured positioning device. The same effect could also have been achieved with only one elongate gripping socket 71.

Figure 5:
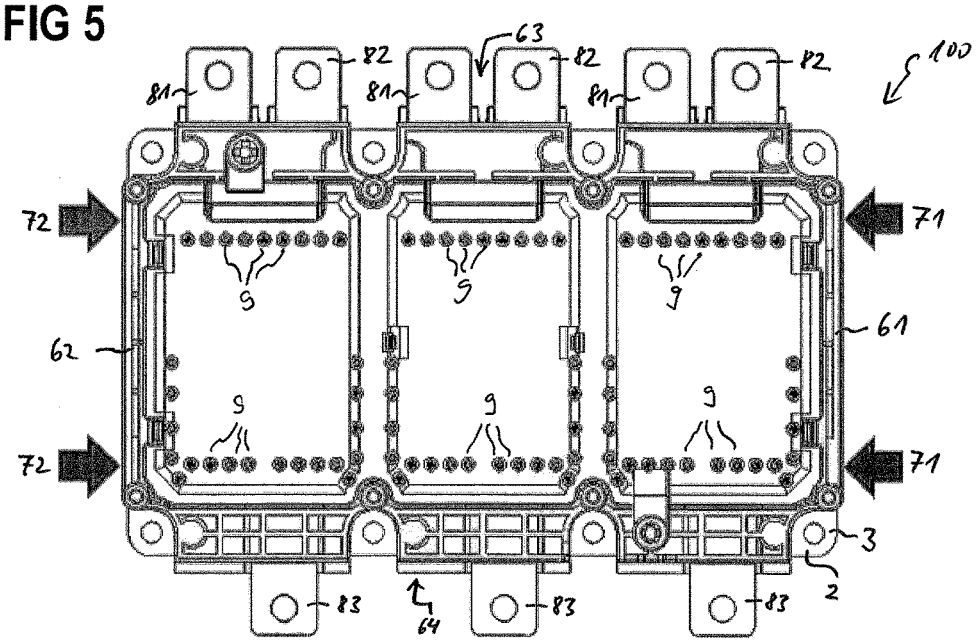
FIG. 5 shows a plan view of the semiconductor module according to FIG. 3.

As can be seen from the plan view according to FIG. 5, two mutually opposing side walls 61 and 62 of the outer housing 6 can respectively comprise two gripping sockets 71 and 72. Thus, two first gripping sockets 71 are formed in the first side wall 61 and two second gripping sockets 72 are formed in the second side wall 62.

Figure 6:
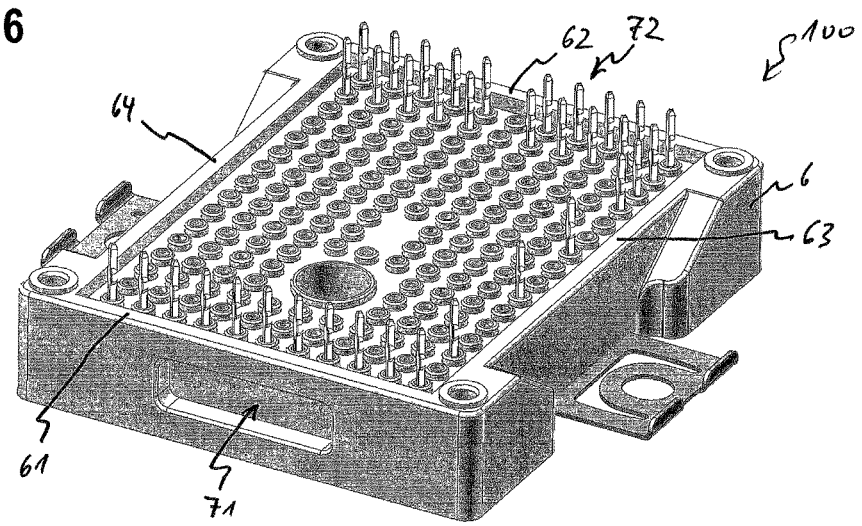
FIG. 6 shows a perspective view of a further semiconductor module.

According to a further configuration, which is shown in FIG. 6, a semiconductor module 100 may respectively have only one gripping socket 71 or 72 on two mutually opposing side walls 61 and 62 of the outer housing 6. Thus, a first gripping socket 71 is formed in the first side wall 61 and a second gripping socket 72—concealed in this case—is formed in the second side wall 62.

Figure 7:
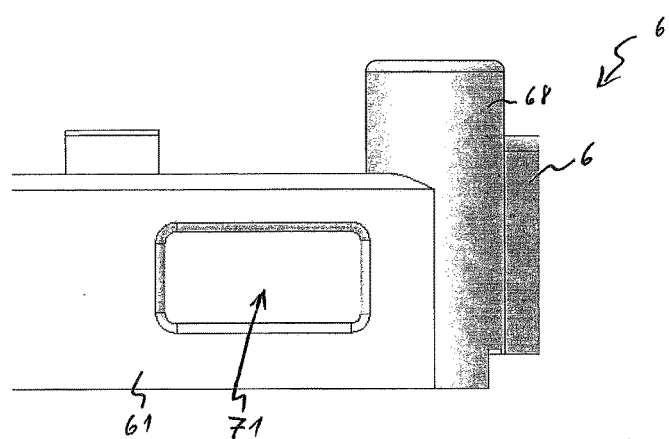
FIG. 7 shows a section, comprising a gripping socket, of a housing for a semiconductor module.
Figure 8:
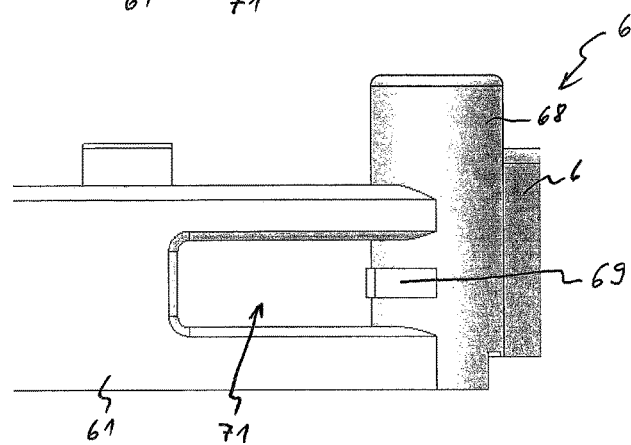
FIG. 8 shows a section, comprising a gripping socket, of another housing for a semiconductor module.

As in FIG. 7 with reference to the example of a first gripping socket 71, a gripping socket may be formed in the outer housing 6 as an indentation which is circumferentially bounded by the material of the outer housing 6, for example a thermoset or thermoplastic. A particular configuration of this is shown by FIG. 8. In this case, the gripping socket 71 is bounded on one of its lateral surfaces by a screw tunnel 68 of the outer housing 6. The screw tunnel 68 is used for feeding through a fastening screw, by means of which the finished semiconductor module 100 can be screwed by the lower side 2*b* (not represented here) onto a carrier, for example a heat sink. Since the screw tunnel 68 has a curved outer side, it is provided with a stop 69 which prevents a gripping finger that engages in the gripping socket 71 from inadvertently slipping out of the gripping socket 71.

Figure 9A:
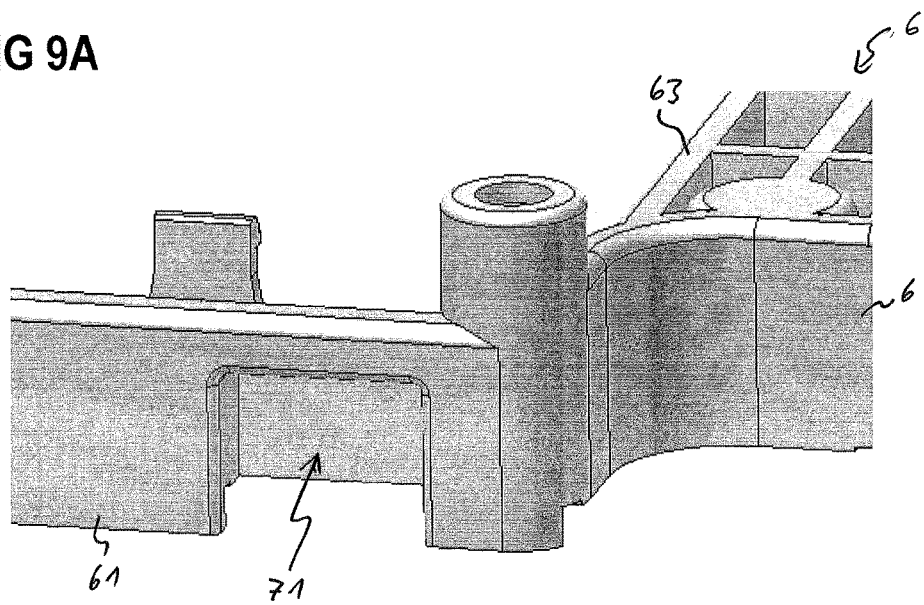
FIG. 9A shows a perspective view of a section, comprising a gripping socket, of yet another housing for a semiconductor module.
Figure 9B:
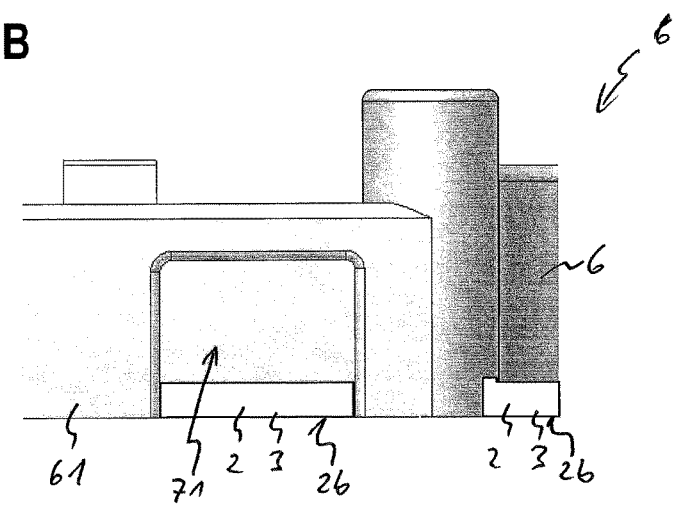
FIG. 9B shows a side view of the housing section according to FIG. 9A after the mounting of a base plate on the housing.

Another variant is shown by FIG. 9A with the aid of an outer housing 6. FIG. 9B shows the finished semiconductor module 100 after the mounting of the circuit carrier 2, which comprises a base plate 3, on the outer housing 6. As can be seen by considering FIGS. 9A and 9B together, an indentation formed in the outer housing 6 is open on its side facing toward the base plate 3. After the mounting of the circuit carrier 2, which comprises the base plate 3, on the outer housing 6, the base plate 3 closes the initially open side of the indentation so as to form a gripping socket 71.

By using one or more gripping sockets 71, 72, a semiconductor module 100 can be gripped and moved with the aid of a positioning device, as is desirable in semiautomatic or fully automatic processing in the scope of production and/or testing of the semiconductor module 100, and/or in the scope of mounting at the customer end. This will be explained below with the aid of FIGS. 10A to 10E with reference to the example of an electrical function test which is carried out on a semiconductor module 100 according to FIG. 2. The method may also be carried out correspondingly with any other desired semiconductor modules 100.

Figure 10A:
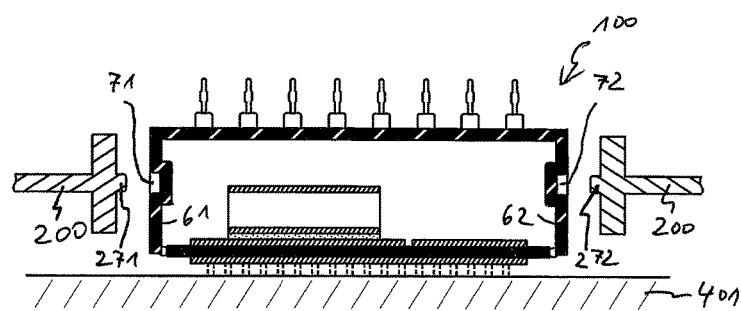
FIGS. 10A to 10E show various steps of a method in which a semiconductor module is moved by means of a positioning device and is then electrically tested.
Figure 10B:
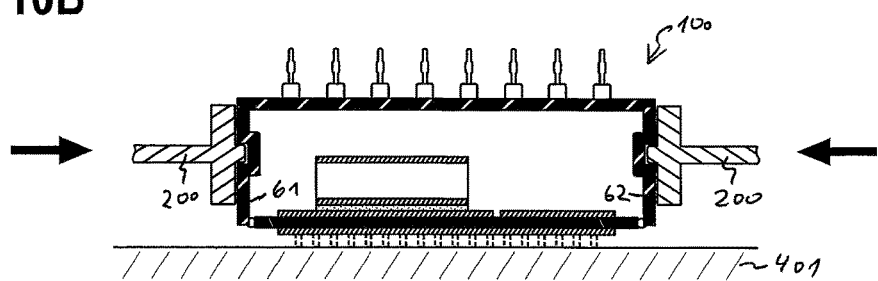
Figure 10C:
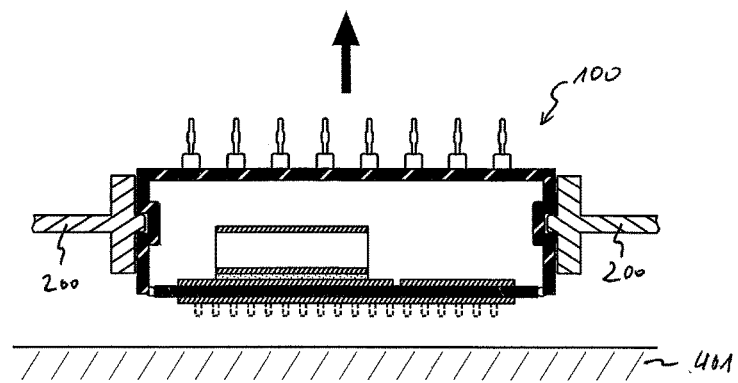

As shown in FIG. 10A, the semiconductor module 100 is initially in a first position in a first spatial orientation. The first position results purely by way of example from the semiconductor module 100 bearing on a first support 401. A positioning device 200, which comprises a first gripping finger 271 and a second gripping finger 272, grips the semiconductor module 100 by the first gripping finger 271 engaging in the first gripping socket 71 and the second gripping finger 272 engaging in the second gripping socket 72, this being represented in FIG. 10B. Now, while maintaining the engagement, as shown in FIG. 10C, by means of the positioning device 200 the semiconductor module 100 can be moved away from the first position and/or have its spatial orientation modified relative to the first spatial orientation. The engagement of both of the gripping fingers 271, 272 in the corresponding gripping sockets 71, 72 may optionally be carried out in such a way that the gripping fingers 271, 272 do not exert any pressure on the relevant side wall 61, 62 during the engagement. This may, for example, be the case when the semiconductor module 100 comprises a thermoplastic-based outer housing 6 and the semiconductor module 100 is subjected to a temperature test at high temperatures. This is because there would then be the risk of the outer housing 6 being deformed if gripping fingers 271, 272 exert pressure on the relevant side wall 61, 62 during the engagement.

Figure 10D:
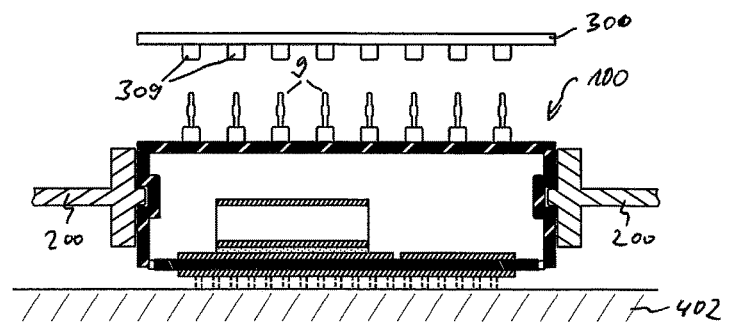
Figure 10E:
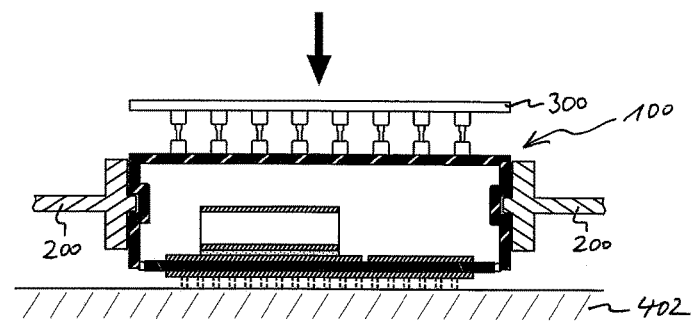

As represented in FIG. 10D, the semiconductor module 100 may in this case be brought from the first position into a second position different to the first position and/or from the first spatial orientation into a second spatial orientation. In the example according to FIG. 10D, the semiconductor module 100 is deposited by the positioning device 200 below an electrical measuring adapter 300 on a second support 402. It would likewise be possible, for example, to deposit the semiconductor module 100 at a different position on the first support 401. In the second position of the semiconductor module 100, its spatial orientation relative to the measuring adapter 300 is selected in such a way that the external electrical terminals 9 face toward the measuring adapter 300. The external terminals 9 of the semiconductor module 100 are then, as shown in FIG. 10E, contacted by corresponding measuring contacts 309 of the measuring adapter 300 and the electrical functionality of the semiconductor module 100 is tested with the aid of the measuring adapter 300.

In order to ensure correct contacting, it is necessary for the module to be positioned exactly under the measuring adapter. Defective contacting of the pointed external terminals 9 may lead to destruction of the module during the measurement and/or to high electrical junction resistances, which may both be damaging to the module and detrimentally affect the measurement. In the event of defective contacting, or even no contacting at all, of external terminals 9 configured as load terminals, scorch marks may also occur, for example when electrical discharges with sparking take place.

During the electrical test, the entire semiconductor module 100 may optionally be tested over an entire high temperature range (for example from −40° C. to +175° C.), i.e., the entire temperature range is run through during the test. The test may furthermore be carried out with heavy load currents in the dynamic range (for example rise times of a few μs or less).

In a corresponding way, as an alternative or in addition, other function tests may also be carried out. In general, one or more test stations may be provided, which are passed through successively by a semiconductor module 100 to be tested. To this end, the semiconductor module 100 may be brought by the positioning device 200 to one test station, tested there, and after the end of the relevant test brought to the next test station, where it is tested again, etc.

Examples of such tests are: dynamic test of the electronic components of the semiconductor module 100 (for example in the range of from 125° C. to 175° C.), short-circuit test (SCSOA=short-circuit safe operating area), switch-off test (RBSOA=reverse bias safe operating area), diode recovery (SOA=safe operation area), static test (for example at room temperature, at −40° C., at +150° C.), forward-bias measurements of IGBTs and diodes (heavy-current measurement; for example VCEsat, VF, . . . ), reverse-bias measurements of IGBTs and diodes (high-voltage measurement; for example VBRCES, . . . ), leakage current measurements (for example ICES, IGES, . . . ), cavity measurement, insulation test.

Figure 11:
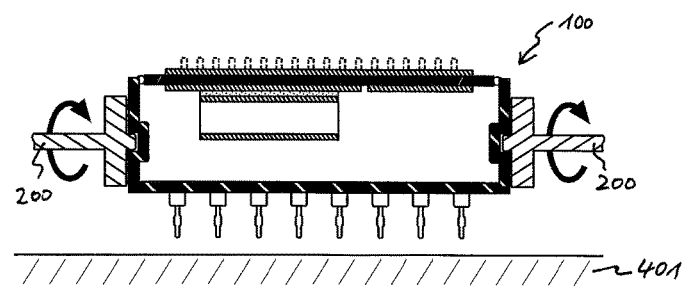
FIG. 11 shows the semiconductor module according to FIG. 10C in an orientation inverted relative to FIG. 10.

FIG. 11 shows another example of the modification of the spatial orientation of the semiconductor module 100 by the positioning device 200, on the basis of the method as described with reference to FIGS. 10A to 10C. The semiconductor module 100 may be raised, lowered, moved to the side, tilted or rotated in any desired way, and in any desired combinations. FIG. 11 represents merely by way of example that the semiconductor module 100—in comparison with its spatial orientation according to FIG. 10C—is inverted, i.e., turned upside down by the positioning device 200.

In general, a semiconductor module 100 with one or more gripping sockets 71, 72 may be positioned in space and spatially oriented in any desired way by means of a positioning device 200 (for example a robotic gripper).

In principle, it may be sufficient for a positioning device 200 to engage with only a single gripping finger 271 in a gripping socket 71 of the semiconductor module 100. For example, the second gripping finger 272 may be omitted from the positioning device 200 shown in FIGS. 10A and 10B, and the right-hand part of the positioning device 2 may press against the second side wall 62 with a planar surface.

More precise guiding may, however, be achieved when two opposing side walls 61 and 62 of the outer housing 6 respectively comprise (at least) one first gripping socket 71 or (at least) one second gripping socket 72, as is the case for example for the semiconductor modules 100 according to FIGS. 3 to 6. While the semiconductor module 100 according to FIG. 6 respectively has precisely one first gripping socket 71 and precisely one second gripping socket 72, on two opposing side walls 61 and 62, the semiconductor module 100 according to FIGS. 3 to 5 has two first gripping sockets 71, which are formed on the first side wall 61, and two second gripping sockets 72, which are formed on the second side wall 62.

Figure 12:
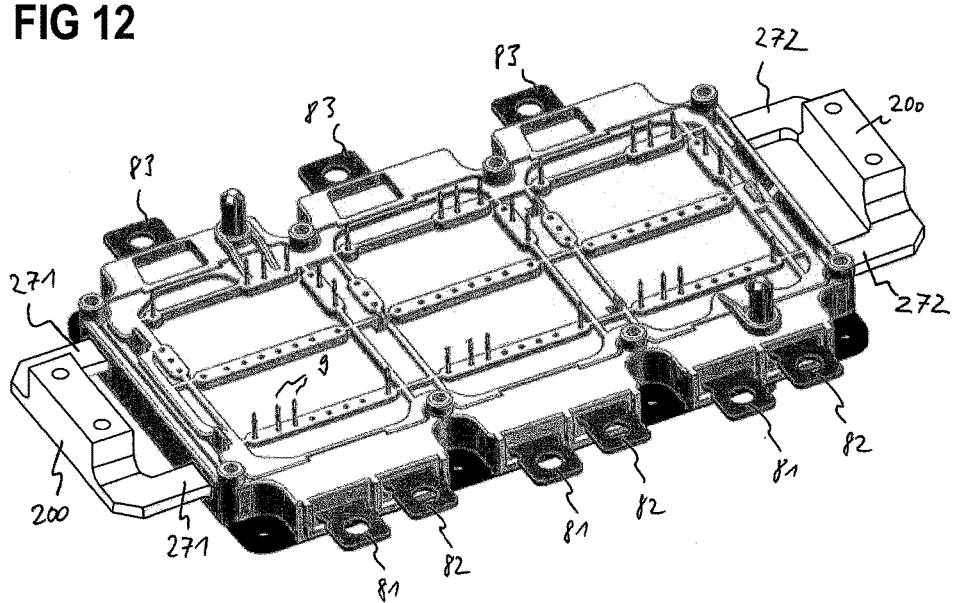
FIG. 12 shows a semiconductor module configured according to FIGS. 3 to 5, of which the gripping sockets of four gripping fingers of a positioning device engage.

FIG. 12 shows yet another semiconductor module 100, which is configured according to FIGS. 3 to 5 and in the gripping sockets 71, 72 of which four gripping fingers 271 or 272 of a positioning device 200 engage. As can be seen in FIG. 12, the first gripping fingers 271, which engage in first gripping sockets 71 and are formed on the same first side wall 61, are optionally rigidly connected to one another. The same applies for the second gripping fingers 272, which engage in second gripping sockets 72 that are formed on the same second side wall 62.

Furthermore, gripping sockets 71, 72 may be configured in such a way that they are laterally closed circumferentially, i.e. they have an annularly closed lateral bounding wall, as is the case for example in FIGS. 6, 7 and 9B.

The present invention has the advantage that the holding of the semiconductor module 100 by a positioning device does not require any magnetic metal parts of the semiconductor module 100. The position of the gripping sockets 71, 72 may be selected outside areas of the semiconductor module 100 in which there are functional parts (for example external terminals 9, 81, 82, 83, a thermal contact surface for dissipating heat on the lower side 2b of the circuit carrier 2). The gripping sockets may thus be separated from the functional parts. By the gripping of the semiconductor module 100 at the gripping sockets 71, 72, damage- and scratch-free holding is ensured. In particular when the outer housing 6 is a plastic housing, scratches and other damage by metal parts, as can occur in the case of conventional positioning devices, can be avoided.

Another advantage of the invention is that short process times and therefore economical production can be achieved, with at the same time a high positioning accuracy. In order to keep the time for the handling of the semiconductor modules short, it is advantageous to move them with high accelerations. In order to achieve this, it is favorable if the semiconductor module 100 to be moved has a low mass. Since a semiconductor module 100 according to the present invention does not need to have heavy magnetic components such as nuts or the like for the purpose of gripping and movement by a positioning device, the present invention allows high accelerations, for example in the range of from about 1.5 g to 2 g (approximately 14.7 m/s$^2$ to 19.6 m/s$^2$).

Both factors, high test temperatures at which the mechanical properties of glass fiber-reinforced thermoplastics decrease, and the high acceleration, determine in combination with a high positioning accuracy the essential requirements for a suitable gripping interface.

The solution proposed here leads to a gripping interface which meets the requirements in terms of thermal stability, mechanical strength and accuracy.

The invention claimed is:

1. A method for gripping a semiconductor module, comprising the steps:
   providing a semiconductor module, the semiconductor module comprising:
   an outer housing having four side walls;
   a circuit carrier, which is mounted on the outer housing and has an upper side and a lower side opposite the upper side;
   a semiconductor chip, which is arranged on the upper side and in the outer housing; and
   a first gripping socket, which is formed as an indentation and extends from the outer side of the outer housing into a first of the side walls;
   providing a positioning device, which has a first gripping finger; and
   gripping the semiconductor module by means of the positioning device, the first gripping finger engaging in the first gripping socket,
   moving the semiconductor module by means of the positioning device after the gripping, wherein the semiconductor module is turned upside down by the positioning device during the moving of the semiconductor module.

2. The method as claimed in claim 1, wherein
   the semiconductor module comprises a second gripping socket, which is formed as an indentation and extends from the outer side of the outer housing into a second of the side walls; and
   the positioning device has a second gripping finger, which engages in the second gripping socket during the gripping of the semiconductor module.

3. A method for moving a semiconductor module, comprising:
   providing a semiconductor module, the semiconductor module comprising:
   an outer housing having four side walls;
   a circuit carrier, which is mounted on the outer housing and has an upper side and a lower side opposite the upper side;
   a semiconductor chip, which is arranged on the upper side and in the outer housing; and
   a first gripping socket, which is formed as an indentation and extends from the outer side of the outer housing into a first of the side walls;
   providing a positioning device, which has a first gripping finger;
   gripping the semiconductor module by means of the positioning device, the first gripping finger engaging in the first gripping socket; and
   moving the semiconductor module by means of the positioning device after the gripping wherein the semiconductor module is turned upside down by the positioning device during the moving of the semiconductor module.

4. A method for electrically testing a semiconductor module, the semiconductor module comprising an outer housing having four side walls, a circuit carrier, which is mounted on the outer housing and has an upper side and a lower side opposite the upper side, a semiconductor chip, which is arranged on the upper side and in the outer housing, a first gripping socket, which is formed as an indentation and extends from the outer side of the outer housing into a first of the side walls; and a number of external electrical terminals on a side of the outer housing that faces away from the circuit carrier, the method comprising the following steps:
   providing an electrical measuring adapter;
   moving the semiconductor module by means of a positioning device after gripping the semiconductor module by means of the positioning device in such a way that the semiconductor module is positioned relative to the measuring adapter so that the external electrical terminals face toward the measuring adapter,
   wherein the semiconductor module is turned upside down by the positioning device during the moving of the semiconductor module; and
   electrically contacting the external terminals by means of the measuring adapter and subsequently testing the electrical functionality of the semiconductor module.

* * * * *

UNITED STATES PATENT AND TRADEMARK OFFICE
CERTIFICATE OF CORRECTION

PATENT NO. : 10,143,099 B2
APPLICATION NO. : 14/830333
DATED : November 27, 2018
INVENTOR(S) : R. Cordes et al.

Page 1 of 1

It is certified that error appears in the above-identified patent and that said Letters Patent is hereby corrected as shown below:

In the Claims

Column 10, Line 12 (Claim 3, Line 20) please change "gripping wherein" to -- gripping, wherein --

Signed and Sealed this
Nineteenth Day of February, 2019

Andrei Iancu
*Director of the United States Patent and Trademark Office*